(12) United States Patent
Shimizu et al.

(10) Patent No.: US 6,599,605 B2
(45) Date of Patent: Jul. 29, 2003

(54) SQUARYLIUM COMPOUNDS AND OPTICAL RECORDING MEDIA USING THE SAME

(75) Inventors: Ikuo Shimizu, Yokkaichi (JP); Hiroshi Toyoda, Yokkaichi (JP); Motoharu Kinugasa, Yokkaichi (JP); Shiho Yamada, Yokkaichi (JP); Masanori Ikuta, Yokkaichi (JP); Kenji Mutoh, Tokyo (JP); Tsutomu Satoh, Tokyo (JP); Tatsuya Tomura, Tokyo (JP)

(73) Assignees: Kyowa Hakko Kogyo Co., Ltd., Tokyo (JP); Kyowa Yuka Co., Ltd., Tokyo (JP); Ricoh Company, Ltd., Tokyo (JP)

( * ) Notice: Subject to any disclaimer, the term of this patent is extended or adjusted under 35 U.S.C. 154(b) by 22 days.

(21) Appl. No.: 09/913,504

(22) PCT Filed: Dec. 15, 2000

(86) PCT No.: PCT/JP00/08890

§ 371 (c)(1),
(2), (4) Date: Nov. 28, 2001

(87) PCT Pub. No.: WO01/44375

PCT Pub. Date: Jun. 21, 2001

(65) Prior Publication Data

US 2003/0082329 A1 May 1, 2003

(30) Foreign Application Priority Data

Dec. 16, 1999 (JP) .......................................... 11-357367

(51) Int. Cl.[7] ................................................. B32B 3/02
(52) U.S. Cl. ................. 428/64.1; 428/64.8; 430/270.14
(58) Field of Search ........................... 428/64.1, 64.4, 428/64.8, 913; 430/270.14, 945, 495.1

(56) References Cited

FOREIGN PATENT DOCUMENTS

| JP | 60-260549 | 12/1985 |
| JP | 06-092914 | 4/1994 |

OTHER PUBLICATIONS

Z. Lu et al.; "Studies on Synthesis and El Properties of Several Novel Squaraines"; Synthetic Metals, vol. 91, No. 1–3, pp. 233–235, 1997.
N. Liu et al.; "Synthesis of New Squarains Used as Organic Electroluminescent Materials"; Chinese Chemical Letters, vol. 8, No. 5 pp. 403–406, 1997.
Oxocarbons, pp. 204–207 (1980).

*Primary Examiner*—Elizabeth Mulvaney
(74) *Attorney, Agent, or Firm*—Finnegan, Henderson, Farabow, Garrett & Dunner, L.L.P.

(57) ABSTRACT

An object of the present invention is to provide novel squarylium compounds having the spectroscopic properties, light resistance, solubility and thermal decomposition properties suitable for a recording material for DVD-R, and optical recording media using the same. More particularly, the present invention provides novel squarylium compounds represented by the general formula (I). In addition, the present invention provides optical recording media having a recording layer containing said squarylium compound.

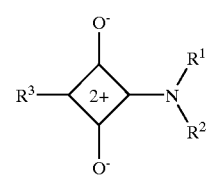

(I)

27 Claims, 1 Drawing Sheet

SQUARYLIUM COMPOUNDS AND OPTICAL RECORDING MEDIA USING THE SAME

TECHNICAL FIELD

The present invention relates to novel squarylium compounds which can be used in the optical recording field, and to optical recording media using the same.

BACKGROUND ART

In recent years, development of a digital versatile disc-recordable (DVD-R) as a recordable optical recording medium having a higher recording density than that of a compact disc-recordable (CD-R) has been under going. Both of CD-R and DVD-R are similar to each other in that an organic dye is utilized therein as a recording material and in a principle of recording and reproducing of a signal (information). Therefore, the organic dyes developed for CD-R can basically comply with the various requirements (light resistance, solubility, thermal decomposition properties) for the recording material of DVD-R other than spectroscopic properties. However, an oscillation wavelength of a semiconductor laser, which is used for recording the signal to DVD-R or for reproducing the signal from DVD-R, is in the range of 600–700 nm, which is shorter than that of the semiconductor laser which is used for CD-R. Accordingly, the recording material utilized for DVD-R should have an absorbance end of a longer wavelength side shorter than that of CD-R when it exists in the form of a membrane. Therefore, the dyes developed for CD-R such as cyanine dyes, azaannulene dyes and indoaniline-metal chelate dyes ("Electronics Related Dyes", CMC, 1998) can not be used as the recording material for DVD-R.

The present inventors have developed squarylium compounds having different two kinds of aromatic substituents in a molecule. Such squarylium compounds have a squaric acid skeleton at a center of the molecule and substituents comprising an aromatic compound on carbon atoms at two catercornered positions of the skeleton. Squarylium compounds having two same aromatic substituents are conveniently referred to as symmetric squarylium compounds (or symmetric squarylium dyes), whereas those having different two kinds of substituents are referred to as asymmetric squarylium compounds (or asymmetric squarylium dyes).

The asymmetric squarylium compound having as a substituent an aromatic ring bound to a squaric acid skeleton with a carbon atom of the aromatic ring and an aromatic amine bound to the squaric acid skeleton with an amino group has been previously known (Japanese Unexamined Patent Publication No. 92914/1994). OXOCARBONS (Academic Press, 1980) describes a compound in which an aromatic substituent bound to the squaric acid skeleton with a carbon atom is phenyl. However, since the color of these compounds is yellow, brown or red, it is believed that the maximum absorption wavelength of these compounds is 500 nm or shorter and, therefore, these compounds can be scarcely used as a recording material for DVD-R from a viewpoint of the spectroscopic properties.

In addition, Japanese Unexamined Patent Publication No. 92914/1994 describes a compound in which an aromatic substituent bound to the squaric acid skeleton with a carbon atom is an azulenyl group. However, the molar extinction coefficient of such a compound is 4.8 or smaller and, therefore, the compound is unsuitable for the recording material for DVD-R from a viewpoint of the spectroscopic properties.

In view of an oscillation wavelength of the semiconductor laser used for DVD-R, for spectroscopic properties of the recording material, which have the close relation with recording and reproducing sensitivities of the signal, it is desirable that the maximum absorption wavelength ($\lambda_{max}$) of the recording material measured in its solution is within the range of 550–600 nm and log $\epsilon$ thereat ($\epsilon$ is a molar extinction coefficient) is 5 or greater. In addition, for thermal decomposition properties of the recording material, which have the close relation with the recording sensitivity, it is desirable that a significant loss in weight is observed within the temperature range of 250–350° C.

Furthermore, although light resistance and solubility in a solvent which is necessary for membrane formation are also required as the property of the recording material, there is no recording material having suitable properties for DVD-R, such as spectroscopic properties, light resistance, solubility and thermal decomposition properties, in the known squarylium compounds.

DISCLOSURE OF THE INVENTION

An object of the present invention is to provide squarylium compounds having spectroscopic properties, light resistance, solubility and thermal decomposition properties suitable as a recording material for DVD-R, and optical recording media using the same.

The present invention was done based on such a finding, and provides squarylium compounds represented by the formula (I):

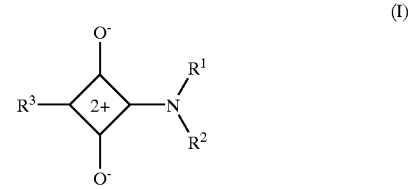

wherein, $R^1$ and $R^2$ are the same or different, and represent a hydrogen atom, an alkyl group optionally having a substituent, an aralkyl group optionally having a substituent, an aryl group optionally having a substituent or a heterocyclic group optionally having a substituent, or $R^1$ and $R^2$ may be taken together with an adjacent nitrogen atom to form a heterocycle, wherein the heterocycle may have a substituent, and $R^3$ represents the general formula (II):

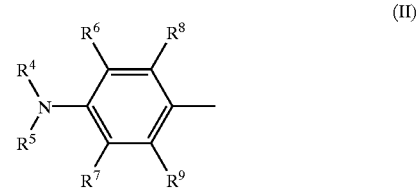

wherein, $R^4$ and $R^5$ are the same or different, and represent a hydrogen atom or an alkyl group, or $R^4$ and $R^5$ may be taken together with an adjacent nitrogen atom to form a heterocycle, and $R^6$, $R^7$, $R^8$ and $R^9$ are the same or different, and represent a hydrogen atom, an alkyl group optionally having a substituent, an alkoxy group optionally having a substituent, a hydroxyl group or a halogen atom, or $R^4$ and $R^6$ or $R^5$ and $R^7$ may be taken together with adjacent N—C—C to form a heterocycle, wherein the heterocycle may have a substituent; or the general formula (III):

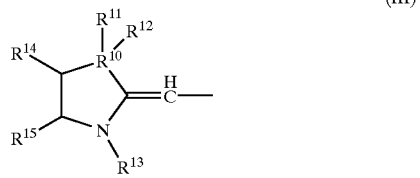

wherein, $R^{10}$ represents a carbon or nitrogen atom, $R^{11}$ and $R^{12}$ are the same or different, and represent a hydrogen atom, an alkyl group optionally having a substituent, an aryl group optionally having a substituent, an aralkyl group optionally having a substituent, or a hydroxyl group (provided that, when $R^{10}$ is a nitrogen atom, then $R^{12}$ is not present), $R^{13}$ represents a hydrogen atom, an alkyl group optionally having a substituent, an aryl group optionally having a substituent or an aralkyl group optionally having a substituent, and $R^{14}$ and $R^{15}$ are the same or different, and represent a hydrogen atom, an alkyl group optionally having a substituent, an alkoxy group or a halogen atom, or $R^{14}$ and $R^{15}$ may be taken together with two adjacent carbon atoms to form an alicyclic hydrocarbon group, an aromatic ring optionally having a substituent or a heterocycle optionally having a substituent.

Also, the present invention provides optical recording media having a recording layer comprising said squarylium compound.

BRIEF DESCRIPTION OF DRAWING

Description of Drawing

Figure 1:
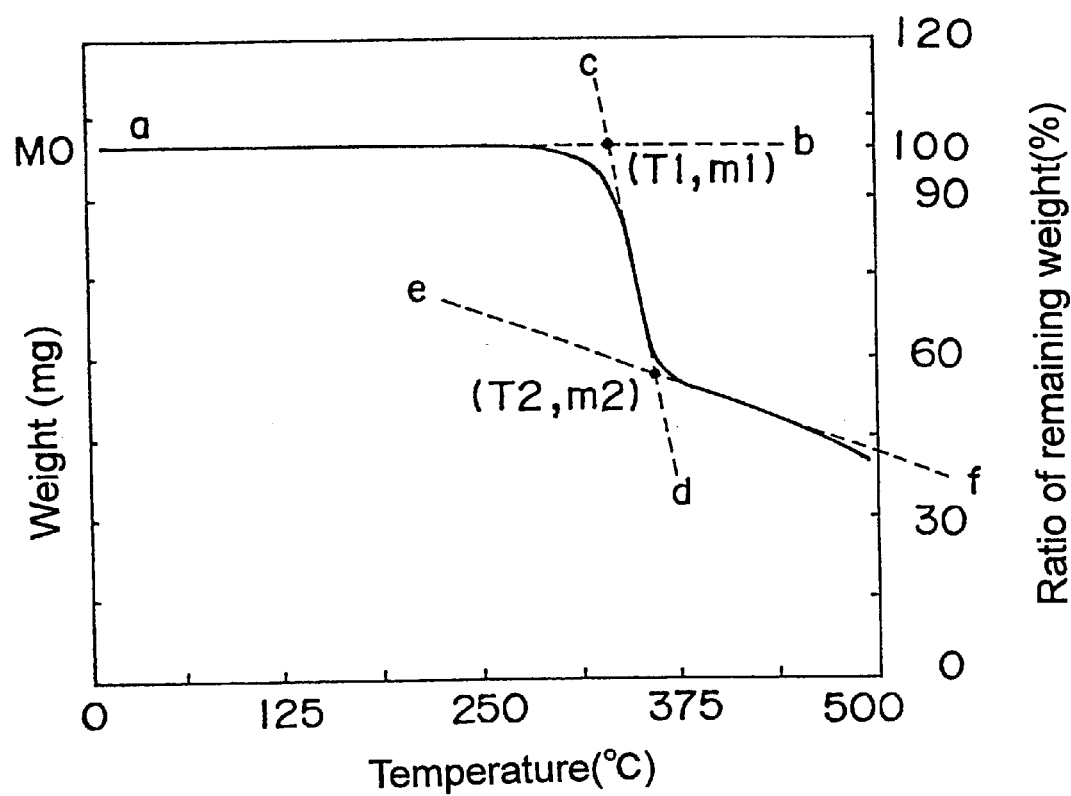

FIG. 1 is a graph illustrating a typical thermogravimetric curve (heating speed of 10° C./min.) for the squarylium compound of the present invention.

Description of Symbols

T1: Weight losing-initiation temperature,
T2: Weight losing-termination temperature,
M0: Initial weight,
m1: Ratio of remaining weight at T1, and
m2: Ratio of remaining weight at T2.

BEST MODE FOR CARRYING OUT THE INVENTION

Detailed Description of the Invention

The present invention will be illustrated below, and herein the compound represented by the formula (I) is referred to as a compound (I). This is also applicable to compounds with the other formula numbers added.

First, in the definitions of substituents in the above formula (I), an alkyl part of the alkyl and alkoxy groups includes straight or branched alkyl groups having from 1 to 6 carbon atoms and cyclic alkyl groups having from 3 to 8 carbon atoms, such as methyl, ethyl, propyl, iso-propyl, butyl, iso-butyl, sec-butyl, tert-butyl, pentyl, iso-pentyl, 1-methylbutyl, 2-methylbutyl, tert-pentyl, hexyl, cyclopropyl, cyclobutyl, cyclopentyl, cyclohexyl, cycloheptyl and cyclooctyl groups, and the like.

An aryl part of the aryl or aralkyl group includes, for example, phenyl, naphthyl and anthryl groups, and the like.

Examples of the aralkyl group include aralkyl groups having from 7 to 15 carbon atoms, such as benzyl, phenethyl, phenylpropyl and naphthylmethyl groups, and the like.

The halogen atom includes each atom of fluorine, chlorine, bromine, and iodine.

The heterocycle in the heterocyclic group or the heterocycle which is formed by $R^{14}$ and $R^{15}$ being taken together with two adjacent carbon atoms includes aromatic heterocycles and alicyclic heterocycles.

Examples of the aromatic heterocycle include 5- or 6-membered monocyclic aromatic heterocycles containing at least one atom selected from nitrogen, oxygen and sulfur atoms, fused di- or tri-cyclic aromatic heterocycles, which are formed by fusing 3- to 8-membered rings and which contain at least one atom selected from nitrogen, oxygen and sulfur atoms, and the like, and, more particularly, include pyridine, pyrazine, pyrimidine, pyridazine, quinoline, isoquinoline, phthalazine, quinazoline, quinoxaline, naphthyridine, cinnoline, pyrrole, pyrazole, imidazole, triazole, tetrazole, thiophene, furan, thiazole, oxazole, indole, isoindole, indazole, benzimidazole, benzotriazole, benzothiazole, benzoxazole, purine and carbazole rings, and the like.

In addition, examples of the alicyclic heterocycle include 5- or 6-membered mono-alicyclic heterocycles containing at least one atom selected from nitrogen, oxygen and sulfur atoms, and fused di- or tri-alicyclic heterocycles, which are formed by fusing 3- to 8-membered rings and which contain at least one atom selected from nitrogen, oxygen and sulfur atoms, and the like, and, more particularly, include pyrrolidine, piperidine, piperazine, morpholine, thiomorpholine, homopiperidine, homopiperazine, tetrahydropyridine, tetrahydroquinoline, tetrahydroisoquinoline, tetrahydrofuran, tetrahydropyran, dihydrobenzofuran and tetrahydrocarbazole rings, and the like.

Examples of the heterocycle which is formed by $R^1$ and $R^2$ or $R^4$ and $R^5$ being taken together with an adjacent nitrogen atom, or formed by $R^4$ and $R^6$ or $R^5$ and $R^7$ being taken together with adjacent N—C—C include an aromatic heterocycle containing a nitrogen atom and an alicyclic heterocycle containing a nitrogen atom.

Examples of the aromatic heterocycle containing a nitrogen atom include 5- or 6-membered monocyclic aromatic heterocycles containing at least one nitrogen atom, fused di- or tri-cyclic aromatic heterocycles containing at least one nitrogen atom, which are formed by fusing 3- to 8-membered rings, and the like, and more particularly include pyridine, pyrazine, pyrimidine, pyridazine, quinoline, isoquinoline, phthalazine, quinazoline, quinoxaline, naphthyridine, cinnoline, pyrrole, pyrazole, imidazole, triazole, tetrazole, thiazole, oxazole, indole, isoindole, indazole, benzimidazole, benzotriazole, benzothiazole, benzoxazole, purine and carbazole rings, and the like.

In addition, examples of the alicyclic heterocycle containing a nitrogen atom include 5- or 6-membered monocyclic alicyclic heterocycles containing at least one nitrogen atom, fused di- or tri-cyclic alicyclic heterocycles containing at least one nitrogen atom, which are formed by fusing 3- to 8-membered rings, and the like and, more particularly, include pyrrolidine, piperidine, piperazine, morpholine, thiomorpholine, homopiperidine, homopiperazine, tetrahydropyridine, tetrahydroquinoline, tetrahydroisoquinoline, tetrahydropyran and tetrahydrocarbazole rings, and the like.

Examples of the alicyclic hydrocarbon ring which is formed by $R^{14}$ and $R^{15}$ being taken together with two adjacent carbon atoms include saturated or unsaturated alicyclic hydrocarbons having from 3 to 8 carbon atoms, such as cyclopropane, cyclobutane, cyclopentane, cyclohexane, cycloheptane, cyclooctane, cyclopentene, 1,3-cyclopentadiene, cyclohexene and cyclohexadiene rings, and the like.

Examples of the aromatic ring which is formed by $R^{14}$ and $R^{15}$ being taken together with two adjacent carbon atoms include aromatic rings having from 6 to 14 carbon atoms, such as benzene, naphthalene and anthracene rings, and the like.

Examples of the substituents for the aryl group, an aralkyl group, a heterocyclic group, aromatic ring, heterocycle containing a nitrogen atom or heterocycle are the same or different 1–5 substituents, such as a hydroxyl group, a carboxyl group, a nitro group, an alkoxy group, an alkyl group, an aralkyl group, a cyano group, a halogen atom, $—R^{16}=R^{17}—Ar$ (wherein, $R^{16}$ and $R^{17}$ are the same and represent N or CH, and Ar represents an aryl group optionally having a substituent selected from the group consisting of a hydroxyl group, a carboxyl group, a nitro group, an alkoxy group, an alkyl group optionally substituted with a halogen group, a cyano group and a halogen atom), and the like. The alkyl group, alkoxy group, aralkyl group, aryl group, and halogen atom have the same meanings as defined above.

Examples of the substituents for the alkyl group or alkoxy group are the same or different 1–3 substituents, such as a hydroxyl group, a carboxyl group, a nitro group, an alkoxy group, an aryl group, and a halogen atom, and the like. The alkoxy group, aralkyl group, aryl group and halogen atom have the same meanings as defined above.

Among the squarylium compounds represented by the general formula (I), preferable compounds are (1) squarylium compounds in which $R^1$ and $R^2$ in the formula are taken together with an adjacent nitrogen atom to form a carbazole ring optionally having a substituent, or (2) squarylium compounds in which $R^1$ in the general formula (I) is a hydrogen atom, and $R^2$ is an aryl group substituted with $—R^{16}=R^{17}—Ar$ ($R^{16}$, $R^{17}$ and Ar have the same meanings as defined above). Moreover, among the compounds (1) and (2) as described above, squarylium compounds in which $R^3$ is a group represented by the general formula (III) are more preferable.

Next, a general method for preparing the compound (I) will be illustrated below.

The compound (I) can be prepared by, for example, reacting 3,4-dichlorobutene-1,2-dione with an aromatic compound, containing a nitrogen atom, which bonds to the squaric acid skeleton at a carbon atom or an aromatic amine which bonds to the squaric acid skeleton at an amino group in a solvent which does not inhibit the reaction, if needed, in the presence of a base, followed by hydrolysis, and reacting under heating the product and an aromatic amine which bonds to the squaric acid skeleton at an amino group or an aromatic compound, containing a nitrogen atom, which bonds to the squaric acid skeleton at a carbon atom in a solvent.

The reaction can be represented by the following Schemes.

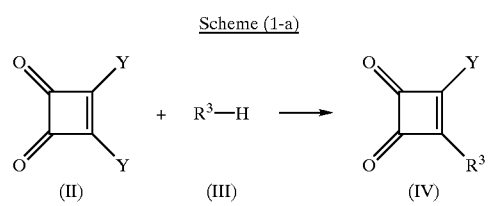

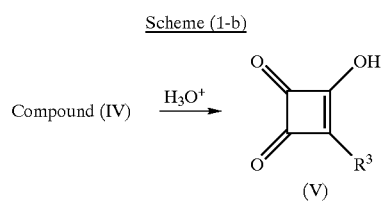

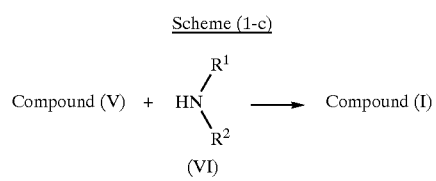

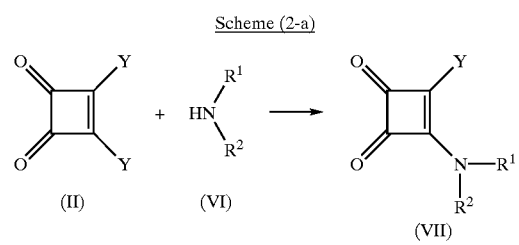

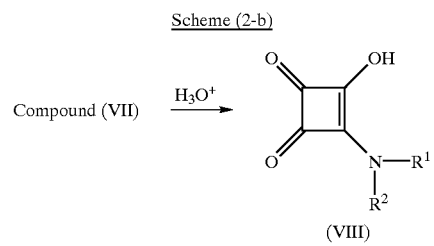

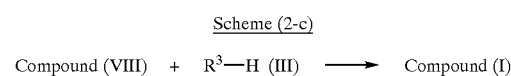

wherein $R^1$, $R^2$ and $R^3$ have the same meanings as defined above, and Y represents a halogen atom such as chlorine or bromine, or $OR^{16}$ ($R^{16}$ represents an alkyl group), wherein the alkyl group has the same meanings as defined above.

Scheme(1-a)

The compound (IV) is prepared by reacting the compound (II) with 0.4- to 2-fold mole of the compound (III) in a solvent, if needed, in the presence of 0.4- to 2-fold mole of a base, at 0° C. to room temperature for 1–4 hours.

Examples of the base include organic bases such as quinoline, triethylamine, pyridine, and the like, and inorganic bases such as potassium carbonate, potassium hydrogen carbonate, sodium hydrogen carbonate, and the like.

Examples of the solvent include chloroform, dichloromethane and 1,2-dichloroethane, ethyl acetate, diethyl ether, methyl-t-butyl ether, tetrahydrofuran, toluene, benzene, dimethylformamide, dimethyl sulfoxide and the like.

Scheme (1-b)

The compound (V) is prepared by reacting the compound (IV) in a 50–90 volume/volume % aqueous solution of acetic acid at 90–110° C. for 1–7 hours, or in 50–99% by weight of an aqueous solution of trifluoroacetic acid or concentrated sulfuric acid at 40–60° C. for 1–3 hours.

Scheme (1-c)

The compound (I) is prepared by reacting the compound (V) with 0.5- to 2-fold mole of the compound (VI), if needed, in the presence of a base, at 80–120° C. for 1–15 hours.

Examples of the solvent to be used include only alcoholic solvents having from 2 to 8 carbon atoms such as ethanol, propanol, iso-propanol, butanol, octanol, and the like, and a mixture of the alcoholic solvent and benzene or toluene (50 volume/volume % or more of alcohol is contained).

Examples of the base to be used include organic bases such as quinoline, triethylamine, pyridine, and the like, and inorganic bases such as potassium carbonate, potassium hydrogen carbonate, sodium hydrogen carbonate, and the like. An amount of the base to be used is preferably 1.0–2.0 equivalents, and more preferably 1.0–1.2 equivalents relative to the compound (V).

Scheme (2-a)

The compound (VII) can be prepared according to a manner similar to that described in Scheme (1-a) except that the compound (VI) is used instead of the compound (III).

Scheme (2-b)

The compound (VIII) can be prepared according to a manner similar to that described in Scheme (1-b) except that the compound (VII) is used instead of the compound (IV).

Scheme(2-c)

The compound (I) can be prepared according to a manner similar to that described in Scheme (1-c) except that the compound (VIII) is used instead of the compound (V) and the compound (III) was used instead of the compound (VI).

After the reaction, the compound (I) is purified and isolated, for example, by conducting distillation of a solvent or filtration, and if needed, by further purification with procedures conventionally utilized in the synthetic organic chemistry (column chromatography, recrystallization, washing with a solvent, or the like).

Embodiments of the compound (I) are shown in Tables 1–3. Compound Nos. in the tables correspond to the Example numbers as described below. In addition, in the tables, Me represents a methyl group, Et represents an ethyl group, and $^n$Bu represents a n-butyl group.

TABLE 1

Embodiments of squarylium compound (I)

| Examples | $R^3$— | $-N{<}{R^1 \atop R^2}$ |
|---|---|---|
| 1 |  | 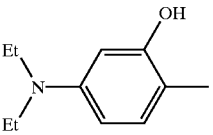 |
| 2 | 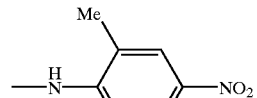 | 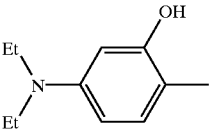 |
| 3 | 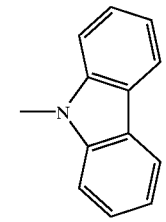 | 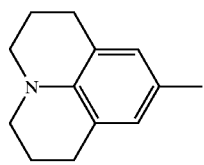 |
| 4 | 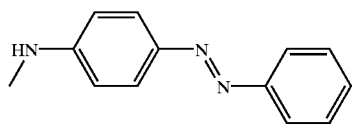 | 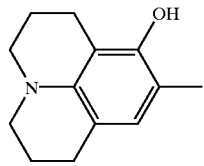 |

TABLE 1-continued
Embodiments of squarylium compound (I)
| Examples | R³— | —N(R¹)(R²) |
|---|---|---|
| 5 |  | 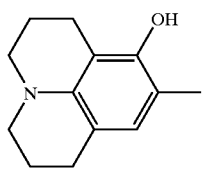 |
| 6 | 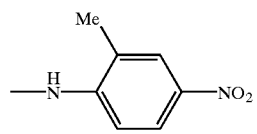 | 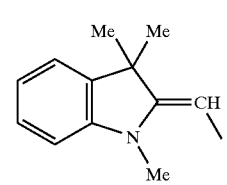 |
| 7 | 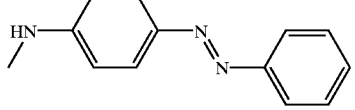 | 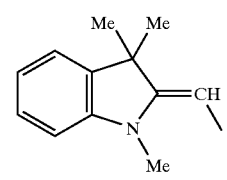 |
TABLE 2
Embodiments of squarylium compound (I)
| Examples | R³— | —N(R¹)(R²) |
|---|---|---|
| 8 | 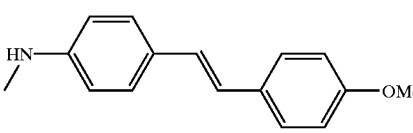 | 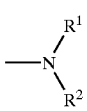 |
| 9 | 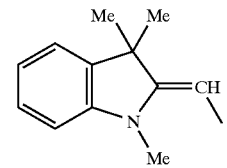 | 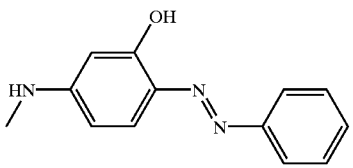 |
| 10 | 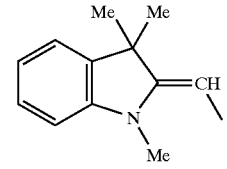 | 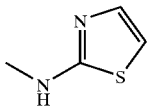 |

TABLE 2-continued

Embodiments of squarylium compound (I)

| Examples | R³— | —N(R¹)(R²) |
|---|---|---|
| 11 | 5-MeO-1,3,3-trimethyl-2-ethylideneindoline | HN(Me)-C₆H₄-N=N-C₆H₅ (para) |
| 12 | 5-MeO-1,3,3-trimethyl-2-ethylideneindoline | HN(Me)-(3-OMe-C₆H₃)-N=N-C₆H₅ |
| 13 | 1,1,3-trimethyl-2-ethylidene-benz[e]indoline | HN(Me)-C₆H₄-N=N-C₆H₅ (para) |
| 14 | 1,1,3-trimethyl-2-ethylidene-benz[e]indoline | 8-(methylamino)quinoline |
| 15 | 1,1,3-trimethyl-2-ethylidene-benz[e]indoline | N(Me)-(2-Me-4-NO₂-C₆H₃) |
| 16 | 1,1,3-trimethyl-2-ethylidene-benz[e]indoline | N-carbazolyl |

TABLE 3

Embodiments of squarylium compound (I)

| Examples | R³— | —N(R¹)(R²) |
|---|---|---|
| 17 | 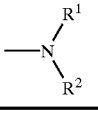 | 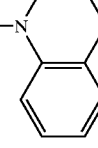 |
| 18 | 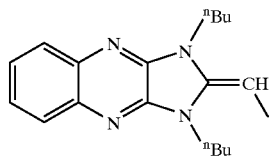 | 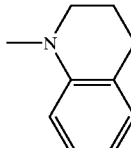 |
| 19 | 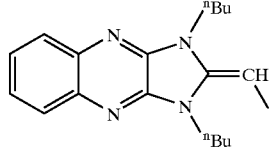 | 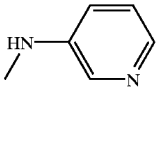 |
| 20 | 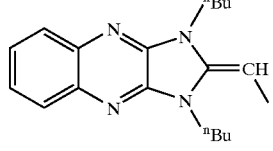 | 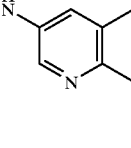 |

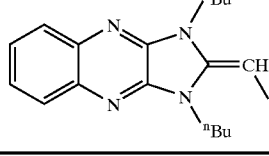

Next, the constitution of a recording medium utilizing the squarylium compound of the present invention (hereinafter, it may be referred to as "a compound of the present invention") will be illustrated.

The physical properties required for a material for a recording layer include optical and thermal properties. The optical properties are preferably such that there is a large absorption band at a shorter wavelength side than 600–700 nm, preferably 630–690 nm, which is a recording or reproducing wavelength of DVD-R or the like, and a recording or reproducing wavelength is in the vicinity of a longer wavelength end of the above-mentioned absorption band. This means that the above-mentioned material for the recording layer has a greater refractive index and extinction coefficient within 600–700 nm, which is a recording or reproducing wavelength.

More particularly, the refractive index "n" of a single layer of the recording layer is preferably 1.5–3.0, and the extinction coefficient "k" of a single layer of the recording layer is preferably within the range of 0.02–0.3, at the wavelength range of the recording or reproducing wavelength±5 nm in the vicinity of the longer wavelength end of the above-mentioned absorption band. When "n" is 1.5 or greater, a modulation depth of recording becomes higher, and when "n" is 3.0 or smaller, an error does not occur with the light in the recording or reproducing wavelength range. In addition, when "k" is 0.02 or greater, the recording sensitivity is improved and, when "k" is 0.3 or smaller, the reflectance of 50% or greater can be easily obtained.

In addition, the maximum absorption wavelength ($\lambda_{max}$) of the material for the recording layer which is measured in its solution is preferably within the range of 550–600 nm, and log $\epsilon$ thereat ($\epsilon$ is a molar extinction coefficient) is preferably 5 or bigger.

In order to evaluate the thermal properties of the aforementioned squarylium compound, thermogravimetric analysis was performed to observe the loss in weight due to temperature rising. Herein, among some loss-in-weight processes (loss process), one having the greatest degree of the loss in weight is referred to as a principal loss-in-weight process.

For the thermal properties, it is necessary that the loss in weight in the principal loss-in-weight process is steep relative to a temperature change, because the compound of the present invention is decomposed in the principal loss-in-weight process, and causes a decrease in a membrane thickness and a change in optical constants and, thereby, a recording portion in an optical sense is formed. Accordingly, when the loss in weight in the principal loss-in-weight process is shelvy relative to the temperature change, it becomes extremely disadvantageous to form a high density recording portion because the recording portion is formed over a wide temperature range. For the similar reason, the material having multiple loss-in-weight processes is also disadvantageous in application to the high recording density.

In the present invention, the temperature slope of the loss in weight is calculated as follows.

As illustrated in FIG. 1, a temperature of the compound of the present invention of the weight M0 is risen at a rate of 10° C./min. under the nitrogen atmosphere. As the temperature rises, the weight of the compound slightly decreases almost along the straight line a-b, and the weight steeply decreases almost along the straight line c-d after reaching the certain temperature. As the temperature further rises, a steep loss in weight is terminated and the loss in weight almost along the straight line e-f is caused. In the graph, at an intersection point of the straight lines a-b and c-d, a temperature is defined as T1 (°C.), and a ratio of the remaining weight relative to the initial weight M0 is defined as m1 (%). In addition, at an intersection point of the straight lines c-d and e-f, a temperature is defined as T2 (°C.), and a ratio of the remaining weight relative to the initial weight M0 is defined as m2 (%).

That is, in the principal loss-in-weight process, a weight losing-initiation temperature is T1, a weight losing-termination temperature is T2, and a ratio of the loss in weight is represented by:

(m1−m2) (%), and a temperature slope of the loss in weight is represented by:

(m1−m2)(%)/(T2−T1)(°C.).

According to the above definitions, a recording material utilized for the optical information recording medium has preferably the temperature slope of the loss in weight in the principal loss-in-weight process of 1%/°C. or greater. When the recording material having the temperature slope of the loss in weight of 1%/°C. or greater is used, a groove width of the recording portion is not widen, and a shorter recording portion can be easily formed.

In addition, the ratio of the loss in weight in the principal loss-in-weight process for the recording material is preferably 20% or greater. When the ratio of the loss in weight is 20% or greater, it allows a better modulation depth of recording and recording sensitivity.

Moreover, for the thermal properties, it is necessary that the weight losing-initiation temperature (T1) is within the particular temperature range. More particularly, the weight losing-initiation temperature is preferably 350° C. or lower, and more preferably within the range of 250–350° C. When the weight losing-initiation temperature is 350° C. or lower, it is not necessary to raise the power of the recording laser beam, and when it is 250° C. or higher, it is preferable in a recording stability sense.

The preferable substrate shape is under the condition that a track pitch is within the range of 0.7–0.8 μm and a groove width at the half band width is within the range of 0.20–0.36 μm.

The substrate usually has a guiding groove having a depth of 1,000–2,500 Å. The track pitch is usually 0.7–1.0 μm, but is preferably 0.7–0.8 μm for the high recording density application. The groove width is preferably 0.18–0.36 μm as the half band width. When the groove width is 0.18 μm or wider, the adequate strength of a tracking error signal can be easily detected, whereas when it is 0.36 μm or narrower, the recording portion is hardly widened in a traverse direction upon recording, being preferable.

1. The Structure of an Optical Recording Medium

The optical recording medium of the present invention may be formed into an air-sandwich structure or into a closely adhered structure which is applied to general recordable discs, or may be formed into a structure of a recordable optical recording medium such as CD-R, DVD-R, or the like.

2. The Required Properties and Embodiments of Constituent Materials for Each Layer The optical recording medium of the present invention has a basic structure in which a first substrate and a second substrate are adhered via a recording layer with an adhesive. The recording layer may be a single layer of an organic dye layer comprising the compound of the present invention, or may be a laminated layer of the organic dye layer and a metal refractive layer for enhancing the reflectance. Between the recording layer and the substrate, an undercoat layer or a protective layer may be built-up, or they may be laminated for improving the function. Most frequently used structure is the first substrate/the organic dye layer/the metal refractive layer/the protective layer/the adhesive layer/the second substrate.

a. Substrate

The substrate to be used should be transmittable to the wavelength of the laser beam to be used when recording or reproducing is conducted from a substrate side, but it is not necessary for the substrate to be transmittable to the wavelength when recording or reproducing is conducted from a recording layer side. As the material for the substrate, for example, plastics such as polyester, acrylic resin, polyamide, polycarbonate resin, polyolefin resin, phenolic resin, epoxy resin, polyimide, or the like, glasses, ceramics, metals or the like may be used. Furthermore, a guiding groove or a guiding pit for tracking, a preformat such as an addressing signal, or the like may be formed on a surface of the substrate.

b. Recording Layer

The recording layer is a layer in which some optical change is caused by irradiation with a laser beam and, thereby, an information is recorded, and should contain the compound of the present invention. The compounds of the present invention may be used alone or in combination of two or more for forming the recording layer.

In addition, the compound of the present invention may be used by mixing it or laminating it with other organic dyes, metals or metal compounds for the purpose of enhancement of the optical properties, the recording sensitivity, the signal properties, or the like. Examples of the organic dye include a polymethine dye, naphthalocyanine, phthalocyanine, squarylium, croconium, pyrylium, naphthoquinone, anthraquinone (indanthrene), xanthene, triphenylmethane, azulene, tetrahydrocholine, phenanthrene and triphenothiazine dyes, metal complex compounds, and the like. Examples of the metal and metal compound include In, Te, Bi, Se, Sb, Ge, Sn, Al, Be, $TeO_2$, SnO, As, Cd, and the like, each of which may be used in the form of dispersion mixture or lamination.

It is possible to enhance the light resistance significantly by mixing a light stabilizer into the compound of the present invention. As the light stabilizer, metal complexes and aromatic amines are preferable. Embodiments of the light stabilizer will be listed below (see Tables 4 and 5).

The mixing ratio of the light stabilizer relative to the compound of the present invention is preferably 5–40% by weight. When the ratio is less than 5% by weight, the effect is low, whereas when the ratio is above 40% by weight, the recording or reproducing properties may be adversely effected in some cases.

In addition, macromolecular materials, for example, various materials such as ionomer resin, polyamide resin, vinyl resin, natural polymer, silicone or liquid rubber, or silane coupling agents may be dispersed and mixed into the compound of the present invention, and additives such as stabilizers (for example, transition metal complex), dispersing agents, flame retardants, lubricants, antistatic agents, surfactants or plasticizers may be used together for the purpose of modifying the properties.

The recording layer may be formed using conventional methods such as a deposition, a sputtering, a chemical vapor deposition or a solvent coating. In the case where the coating method is used, the dye comprising the compound of the present invention optionally with the aforementioned additives added or the like is dissolved in an organic solvent, and the solution is coated by the conventional coating method such as a spraying, a roller coating, a dipping or a spin coating.

Examples of the organic solvent to be used generally include alcohols such as methanol, ethanol and iso-propanol, ketones such as acetone, methyl ethyl ketone and cyclohexanone, amides such as N,N-dimethylformamide and N,N-dimethylacetoamide, sulfoxides such as dimethyl sulfoxide, ethers such as tetrahydrofuran, dioxane, diethyl ether and ethyleneglycol monomethyl ether, esters such as methyl acetate and ethyl acetate, aliphatic halogenated hydrocarbons such as chloroform, methylene chloride, dichloroethane, carbon tetrachloride and trichloroethane, aromatic compounds such as benzene, xylene, monochlorobenzene and dichlorobenzene, cellosolves such as methoxyethanol and ethoxyethanol, and hydrocarbons such as hexane, pentane, cyclohexane and methylcyclohexane.

The membrane thickness of the recording layer is preferably 100 Å–10 μm, more preferably 200–2,000 Å.

Embodiments of the light stabilizer to be used in combination with the compound of the present invention are shown below.

(1) Metal complex-light stabilizers (see Table 4)

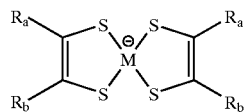

(A)

wherein $R_a$ and $R_b$ are the same or different, and represent a hydrogen atom, an alkyl group optionally having a substituent, an aryl group or a heterocyclic group.

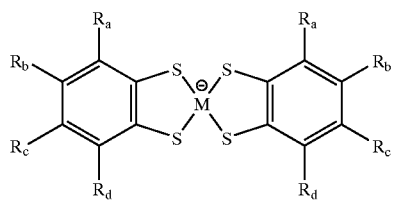

(B)

wherein $R_a$, $R_b$, $R_c$ and $R_d$ are the same or different, and represent a hydrogen atom, a halogen atom, an alkyl group bonding directly or indirectly via a divalent linking group, an aryl group, a cyclic alkyl group or a heterocyclic group.

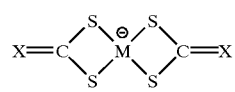

(C)

wherein X represents O, S or $CR_aR_b$, wherein $R_a$ and $R_b$ represent CN, $COR_c$, $COOR_d$, $CONR_eR_f$, $SO_2R_g$, or a group of atoms necessary for forming a 5- or 6-membered ring, and wherein $R_c$–$R_g$ are the same or different, and represent an alkyl group optionally having a substituent or an aryl group.

(D)

wherein $R_a$, $R_b$, $R_c$ and $R_d$ are the same or different, and represent a hydrogen atom, a halogen atom, an alkyl group bonding directly or indirectly via a divalent linking group, an aryl group, a cyclic alkyl group or a heterocyclic group, and $R_e$ represents a hydrogen atom, an alkyl group, an aryl group, an acyl group, a carboxyl group, an alkoxycarbonylalkyl group or a sulfo group.

(E)

wherein $R_a$, $R_b$, $R_c$ and $R_d$ are the same or different, and represent a hydrogen atom, a halogen atom, an alkyl group bonding directly or indirectly via a divalent linking group, an aryl group, a cyclic alkyl group or a heterocyclic group, and $R_e$ and $R_f$ are the same or different, and represent a hydrogen atom, an alkyl group, an aryl group, an acyl group, a carboxyl group or a sulfo group.

(F)

wherein X represents O or S, $R_a$, $R_b$ and $R_c$ are the same or different, and represent an alkyl group optionally having a substituent bonding directly or via an oxy group, a thio group or an amino group, an aryl group or a cyclic alkyl group, and the symbol:

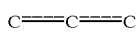

represents C=C—C or C—C=C.

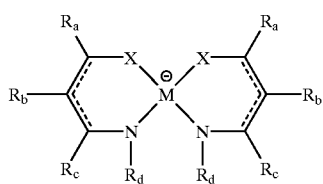

(G)

wherein X represents O or S, $R_a$, $R_b$ and $R_c$ are the same or different, and represent an alkyl group optionally having a substituent bonding directly or via an oxy group, a thio group or an amino group, an aryl group or a cyclic alkyl group, and $R_d$ represents an alkyl group or an aryl group, and the symbol:

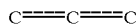

represents C=C—C or C—C=C.

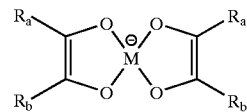

wherein $R_a$ and $R_b$ are the same or different, and represent a hydrogen atom, an alkyl group optionally having a substituent, or an aryl group or a heterocyclic group.

(I)

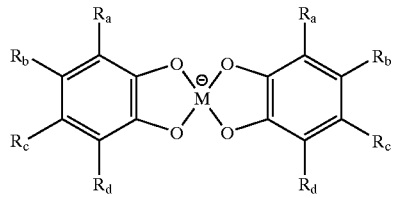

wherein $R_a$, $R_b$, $R_c$ and $R_d$ are the same or different, and represent a hydrogen atom, a halogen atom, an alkyl group bonding directly or indirectly via a divalent linking group, an aryl group, a cyclic alkyl group or a heterocyclic group.

(J)

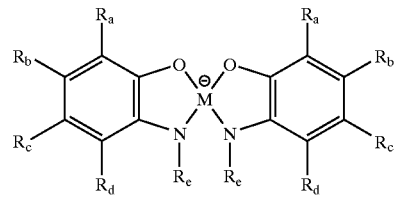

wherein $R_a$, $R_b$, $R_c$ and $R_d$ are the same or different, and represent a hydrogen atom, a halogen atom, an alkyl group bonding directly or indirectly via a divalent linking group, an aryl group, a cyclic alkyl group or a heterocyclic group, $R_e$ represents a hydrogen atom, an alkyl group, an aryl group, an acyl group, a carboxyl group or a sulfo group.

In the formulae (A)—(J), M represents a transition metal such as Ni, Pd, Pt, Cu, Co, or the like, and may have a charge to form a salt with a cation, and in addition, other ligands may be bonded above or below M. Such salts may be used also as a light stabilizer. The alkyl, cyclic alkyl, aryl and heterocyclic groups and substituents therefor include those described above.

More preferable embodiments are shown in Table 4.

TABLE 4

Embodiments of metal complex-light stabilizers

| Metal Complex Nos. | Corresponding Structure | $R_a$ | $R_b$ | $R_c$ | $R_d$ | $R_e$ | $R_f$ | X | M | Counter Cation |
|---|---|---|---|---|---|---|---|---|---|---|
| 1 | (A) | Ph | Ph | — | — | — | — | — | Cu | $NBu_4$ |
| 2 | (A) | $C_4H_9$ | $C_4H_9$ | — | — | — | — | — | Ni | — |
| 3 | (B) | Cl | H | Cl | Cl | — | — | — | Ni | $NBu_4$ |
| 4 | (B) | H | $OCH_3$ | H | H | — | — | — | Cu | — |
| 5 | (C) | — | — | — | — | — | — | O | Co | $NBu_4$ |
| 6 | (C) | — | — | — | — | — | — | S | Ni | CN |
| 7 | (D) | H | $OCH_3$ | H | H | $CH_2COOEt$ | — | — | Pd | $NBu_4$ |
| 8 | (D) | H | H | H | H | $CH_3$ | — | — | Ni | $PBu_4$ |
| 9 | (D) | H | $CH_3$ | H | H | $CH_3$ | — | — | Pt | $NPe_4$ |
| 10 | (E) | H | H | H | H | $CH_3$ | $CH_3$ | — | Ni | $NBu_4$ |
| 11 | (E) | H | $OCH_3$ | H | H | $C_2H_5$ | $C_2H_5$ | — | Pt | $NEt_4$ |
| 12 | (F) | H | H | H | — | — | — | O | Cu | $NBu_4$ |
| 13 | (F) | H | H | H | — | — | — | O | Ni | $PBu_4$ |
| 14 | (F) | H | Ph | H | — | — | — | S | Ni | $NOc_4$ |
| 15 | (G) | H | H | H | H | — | — | O | Ni | $NBu_4$ |
| 16 | (G) | H | H | H | H | — | — | S | Ni | $PEt_4$ |
| 17 | (H) | Ph | Ph | — | — | — | — | — | Pd | $NBu_4$ |
| 18 | (I) | H | H | H | H | — | — | — | Ni | $NBu_4$ |
| 19 | (I) | H | $OCH_3$ | H | H | — | — | — | Ni | $PEt_4$ |
| 20 | (J) | H | H | H | H | $CH_3$ | — | — | Ni | $NBu_4$ |
| 21 | (J) | H | H | H | H | $C_4H_9$ | — | — | Ni | $PBu_4$ |
| 22 | (J) | H | $CH_3$ | H | H | $C_4H_9$ | — | — | Cu | $NOc_4$ |

Et: ethyl group,
Bu: butyl group;
Pe: pentyl group,
Oc: octyl group, and
Ph: phenyl group 2) Aromatic amine-light stabilizers (see Table 5)
Following compounds may be used.

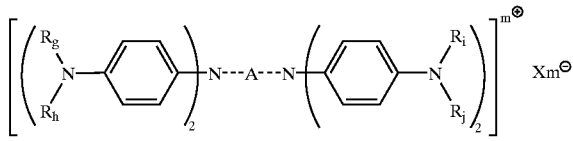

wherein $R_g$, $R_h$, $R_i$ and $R_j$ are the same or different, and each represents a hydrogen atom, or an alkyl group optionally having a substituent, X represents an acid anion, and A is, when m is 1 or 2,

wherein p is 1 or 2, and is, when m is 2,

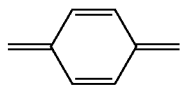

wherein all of existing aromatic rings may be substituted with an alkyl group having from 1 to 6 carbon atoms, an alkoxy group having from 1 to 6 carbon atoms, a halogen atom or a hydroxyl group.

More preferred embodiments are shown in Table 5.

TABLE 5

Embodiments of aminium, imonium and diimonium compounds

| Compound Nos. | $R_g$ | $R_h$ | $R_i$ | $R_j$ | A | X | m |
|---|---|---|---|---|---|---|---|
| 101 | $C_2H_5$ | $C_2H_5$ | $C_2H_5$ | $C_2H_5$ | Z1, p = 2 | $ClO_4$ | 1 |
| 102 | $C_2H_5$ | $C_2H_5$ | $C_2H_5$ | $C_2H_5$ | Z1, p = 1 | $SbF_6$ | 1 |
| 103 | $C_3H_7$ | $C_3H_7$ | $C_3H_7$ | $C_3H_7$ | Z1, p = 1 | Br | 1 |
| 104 | $C_3H_7$ | $C_3H_7$ | $C_3H_7$ | $C_3H_7$ | Z1, p = 2 | $PF_6$ | 1 |
| 105 | $C_4H_9$ | $C_4H_9$ | $C_4H_9$ | $C_4H_9$ | Z1, p = 1 | $ClO_4$ | 1 |
| 106 | $C_3H_7$ | H | $C_3H_7$ | H | Z1, p = 1 | $ClO_4$ | 1 |
| 107 | $C_2H_5$ | $C_2H_5$ | $C_2H_5$ | $C_2H_5$ | Z1, p = 2 | Cl | 1 |
| 108 | $C_6H_{13}$ | H | $C_6H_{13}$ | H | Z1, p = 1 | $SbF_6$ | 1 |
| 109 | $C_6H_{13}$ | H | $C_6H_{13}$ | H | Z1, p = 1 | $ClO_4$ | 1 |
| 110 | $C_2H_5$ | $C_2H_5$ | $C_2H_5$ | $C_2H_5$ | Z1, p = 1 | $SbF_6$ | 1 |
| 111 | $C_3H_7$ | $C_3H_7$ | $C_3H_7$ | $C_3H_7$ | Z1, p = 2 | $ClO_4$ | 1 |
| 112 | $C_2H_5$ | $C_2H_5$ | $C_2H_5$ | $C_2H_5$ | Z2 | $PF_6$ | 2 |
| 113 | $C_2H_5$ | $C_2H_5$ | $C_2H_5$ | $C_2H_5$ | Z2 | $ClO_4$ | 2 |
| 114 | $C_3H_7$ | $C_3H_7$ | $C_3H_7$ | $C_3H_7$ | Z2 | $SbF_6$ | 2 |
| 115 | $C_3H_7$ | H | $C_3H_7$ | H | Z2 | $AsF_6$ | 2 |
| 116 | $C_4H_9$ | $C_4H_9$ | $C_4H_9$ | $C_4H_9$ | Z2 | I | 2 |
| 117 | $C_6H_{13}$ | H | $C_6H_{13}$ | H | Z2 | $ClO_4$ | 2 |

Z1: 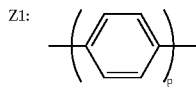

Z2: 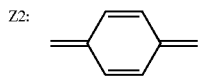

c. Undercoat Layer

The undercoat layer is used for the purpose of (1) an improvement of adherability, (2) a barrier against water, gases, or the like, (3) an improvement of the storage stability of the recording layer, (4) an enhancement of the reflectance, (5) a protection of the substrate from a solvent, (6) a formation of a guiding groove, guiding pit or preformat, or the like. With regard to the purpose of (1), macromolecular materials, for example, various polymers such as ionomer resin, polyamide resin, vinyl resin, natural resin, natural polymer, silicone, liquid rubber, or the like, silane coupling agents, or the like may be used. With regard to the purposes of (2) and (3), in addition to the aforementioned macromolecular materials, inorganic compounds such as SiO, MgF, $SiO_2$, TiO, ZnO, TiN, SiN, or the like, and further metals or semimetals such as Zn, Cu, Ni, Cr, Ge, Se, Au, Ag, Al, or the like may be used. Moreover, with regard to the purpose of (4), metals such as Al, Au, Ag, or the like, or organic films having metallic luster such as a methine dye, a xanthene dye, or the like may be used. With regard to the purposes of (5) and (6), a ultraviolet-curing resin, a thermosetting resin, a thermoplastic resin, or the like may be used.

The membrane thickness of the undercoat layer is preferably 0.01–30 μm, more preferably 0.05–10 μm.

d. Metal Refractive Layer

Examples of the material for the metal refractive layer include poorly erodable metals, semimetals, and the like exhibiting a high reflectance themselves. Embodiments of the material for the metal refractive layer include Au, Ag, Cr, Ni, Al, Fe, Sn, and the like, but Au, Ag and Al are most preferred from a viewpoint of the reflectance and productivity. These metals or semimetals may be used alone or as an alloy of two of them.

The method for forming a membrane includes a vapor deposition, a sputtering, and the like. The membrane thickness of the metal refractive layer is preferably 50–5,000 Å, more preferably 100–3,000 Å.

e. Protective Layer, Substrate Surface-hard Coating Layer

A protective layer and a substrate surface-hard coating layer are used for the purpose of (1) a protection of the recording layer (refraction absorbing layer) from flaw, dust, dirt or the like., (2) an improvement in the storage stability of the recording layer (refraction absorbing layer), (3) an improvement in the reflectance, or the like. With regard to such purposes, the materials described for the undercoat layer may be used. In addition, SiO, $SiO_2$ or the like may be used as an inorganic material, and thermo-softening resins such as polymethyl acrylate, polycarbonate, polystyrene, polyester, vinyl resin, cellulose, aliphatic hydrocarbons, natural rubber, styrene-butadiene, chloroprene rubber, wax, alkyd, drying oil, or rosin, thermosetting resins such as epoxy resin, phenol resin, polyurethane resin, melamine resin, or urea resin, or ultraviolet-curing resins such as polyester acrylate, epoxy acrylate, urethane acrylate, or silicone acrylate, or the like may be used as an organic material, but among them, the ultraviolet-curing resins may be preferably used in that they have the excellent productivity.

The membrane thickness of the protective layer or the substrate surface-hard coating layer is preferably 0.01–30 μm, more preferably 0.05–10 μm. In the present invention, stabilizers, dispersing agents, flame retardants, lubricants, antistatic agents, surfactants, plasticizers or the like may be incorporated into the above undercoat layer, protective layer and substrate surface-hard coating layer as described for the recording layer.

f. Protective Substrate

A protective substrate should be transmittable to the wavelength of the laser beam to be used when the laser beam is irradiated from this protective substrate side, whereas it may be transmittable or not to the wavelength when it is used as a mere protective plate. The materials which may be used for the protective substrate are the same as those for the substrate, and plastics such as polyester, acrylic resin, polyamide, polycarbonate resin, polyolefin resin, phenol resin, epoxy resin, polyimide, or the like, glasses, ceramics, metals, or the like may be used.

g. Adhesive, Adhesive Layer

As the adhesive, any material which can adhere two recording media may be used, but from a viewpoint of the productivity, ultraviolet-curing or hot melt adhesives are preferred.

EXAMPLE

The following Examples further illustrate the present invention, but are not to be construed to limit the scope of the present invention.

Example 1

1.27 g of 3,4-dichloro-3-cyclobutene-1,2-dione was dissolved in 20 ml of dichloromethane. To this solution, 2.74 g of 3-diethylaminophenol was added dropwise at 0° C., and the mixture was stirred at 0° C. for 1 hour. After the reaction, the precipitate was collected by filtration. The obtained solid was added to a mixture of 6.8 ml of acetic acid and 4 ml of water, and the mixture was allowed to react at 110° C. for 3 hours. After the reaction was completed, the precipitate was collected by filtration. To this, 50 ml of n-butanol, 50 ml of toluene and 0.64 g of 2-methyl-4-nitroaniline were added, and the mixture was allowed to react at 110° C. for 8 hours. After the reaction was completed, the precipitate was collected by filtration to give 0.69 g of the compound 1.

Melting point: 257–258° C.;

Elemental analysis ($C_{21}H_{21}N_3O_5$): Calcd. (%): C, 63.79; H, 5.35; N, 10.63 Found (%): C, 63.67; H, 5.25; N, 10.58;

IR(KBr) cm$^{-1}$:3251, 2973, 1761, 1626, 1381, 1333, 1246, 1223, 1190, 1051, 1078;

$^1$H-NMR δ (CDCl$_3$) ppm: 1.28 (6H, t, J=7.1 Hz), 2.50 (3H, s), 3.50 (4H, q, J=7.1 Hz), 6.14 (1H, m), 6.36 (1H, m), 8.05 (1H, m), 8.10 (1H, m), 8.19 (1H, m), 8.41 (1H, m).

Example 2

In a manner similar to that in Example 1 except that 0.78 g of carbazole was used instead of 2-methyl-4-nitroaniline, 0.1 g of the compound 2 was obtained.

Melting point: 227° C.;

Elemental analysis ($C_{26}H_{22}N_2O_3$): Calcd. (%): C, 76.08; H, 5.40; N, 6.82 Found (%): C, 75.88; H, 5.52; N, 6.84;

Example 3

0.87 g of 3,4-dichloro-3-cyclobutene-1,2-dione was dissolved in 20 ml of dichloromethane. To this solution, 1.99 g of julolidine was added in portions at room temperature, and the mixture was stirred at room temperature for 4.5 hours. After the reaction, the precipitate was collected by filtration. The obtained solid was added to 40 ml of acetic acid and 20 ml of water, and the mixture was allowed to react at 110° C. for 4 hours. After the reaction was completed, the precipitate was collected by filtration. To this, 40 ml of n-butanol, 40 ml of toluene and 0.78 g of 4-aminoazobenzene were added and the mixture was allowed to react at 110° C. for 1.5 hours. After the reaction was completed, the precipitate was collected by filtration to give 1.1 g of the compound 3.

Melting point: 242–244° C.;

Elemental analysis ($C_{28}H_{24}N_4O_2$): Calcd. (%): C, 74.98; H, 5.39; N, 12.49 Found (%): C, 75.16; H, 5.56; N, 12.32;

IR (KBr) cm$^{-1}$:2856, 1765, 1597, 1500, 1425, 1358, 1304, 1200, 968;

$^1$H-NMR δ(CDCl$_3$) ppm: 1.89 (4H, tt, J=5.6, 5.9 Hz), 2.72 (4H, t, J=5.9 Hz), 3.37 (4H, t, J=5.6 Hz), 4.91 (1H, m), 7.21 (2H, m), 7.70 (2H, s), 7.95 (2H, m), 8.07 (1H, m), 8.16 (2H, m), 8.61 (2H, m).

Example 4

1 g of 3,4-dichloro-3-cyclobutene-1,2-dione was dissolved in 11 ml of dichloromethane. To this solution, 0.52 g of 8-hydroxyjulolidine and 0.28 g of triethylamine were added in portions at 0° C., and the mixture was stirred at 0° C. for 1.5 hours. After the reaction, the precipitate was collected by filtration. To the obtained solid, 10 ml of acetic acid and 10 ml of water were added, and the mixture was allowed to react at 110° C. for 2.5 hours. After the reaction was completed, the precipitate was collected by filtration. To this, 40 ml of n-butanol, 40 ml of toluene and 0.27 g of 4-aminoazobenzene were added, and the mixture was allowed to react at 110° C. for 1 hour. After the reaction was completed, the precipitate was collected by filtration to give 0.54 g of the compound 4.

Melting point: 285–286° C.;

Elemental analysis ($C_{28}H_{24}N_4O_3$): Calcd. (%): C, 72.40; H, 5.21; N, 12.06 Found (%): C, 72.27; H, 5.14; N, 11.86;

IR (KBr) cm$^{-1}$:2935, 1763, 1618, 1597, 1502, 1406, 1363, 1342, 1317, 1298, 1228, 1200, 1184, 1153;

$^1$H-NMR δ(CDCl$_3$) ppm: 1.85 (4H, m), 2.60 (4H, m), 7.49–7.62 (4H, m), 7.88 (2H, m), 7.94 (1H, m), 7.95 (1H, s), 8.01 (2H, m).

Example 5

In a manner similar to that in Example 4 except that 0.32 g of 2-methyl-4-nitroaniline was used instead of 4-aminoazobenzene, 0.48 g of the compound 5 was obtained.

Melting point: 267° C.;

Elemental analysis ($C_{23}H_{21}N_3O_5$): Calcd. (%): C, 65.86; H, 5.05; N, 10.02 Found (%): C, 65.89; H, 4.94; N, 9.95;

IR (KBr) cm$^{-1}$:3440, 2931, 1765, 1601, 1497, 1408, 1365, 1306, 1279, 1225, 1205, 1094;

$^1$H-NMR δ(CDCl$_3$) ppm: 1.96 (4H, m), 2.48 (3H, s), 2.71 (4H, m), 3.41 (4H, m), 7.66 (1H, s), 8.07 (1H, m), 8.17 (2H, m), 8.38 (1H, m).

Example 6

0.44 g of 3,4-dichloro-3-cyclobutene-1,2-dione was dissolved in 5 ml of dichloromethane. To this solution, 1.00 g of 1,3,3-trimethyl-2-methyleneindoline was added dropwise at 4° C., and the mixture was stirred at 4° C. for 1.5 hours. After the reaction, the precipitate was collected by filtration. To the obtained solid, 2.7 ml of concentrated sulfuric acid was added, and the mixture was allowed to react at 50° C. for 1 hour. After the reaction was completed, the reaction mixture was poured into an excess amount of water, and the insoluble material was collected by filtration. To this insoluble material, 10 ml of ethanol, 10 ml of toluene and 0.59 g of 4-aminoazobenzene were added, and the mixture was allowed to react at 80° C. for 1 hour. After the reaction was completed, the precipitate was collected by filtration. The obtained solid was purified by subjecting it to column chromatography (eluent: chloroform/methanol=10/1) to give 0.56 g of the compound 6.

Melting point: 286° C. (dec.);

Elemental analysis ($C_{28}H_{24}N_4O_2$): Calcd. (%): C, 74.98; H, 5.39; N, 12.49 Found (%): C, 74.68; H, 5.13; N, 12.42;

¹H-NMR δ(CDCl₃) ppm: 1.70 (6H, s), 3.60 (3H, s), 5.80 (1H, s), 7.18–7.22 (1H, m), 7.37–7.38 (2H, m), 7.53–7.63 (3H, m), 7.86–7.89 (2H, m), 7.92–7.94 (2H, m), 8.10–8.13 (1H, m), 11.65 (1H, broad s).

Example 7

In a manner similar to that in Example 6 except that 0.34 g of 4-amino-4'-methoxy-trans-stilbene was used instead of 4-aminoazobenzene, 0.35 g of the compound 7 was obtained.

Melting point: 293° C. (dec.);

Elemental analysis ($C_{30}H_{28}N_2O_3$): Calcd. (%): C, 78.13; H, 5.92; N, 5.88 Found (%): C, 77.92; H, 5.82; N, 5.77;

¹H-NMR δ(CDCl₃) ppm: 1.68 (6H, s), 3.53 (3H, s), 3.78 (3H, m), 5.70 (1H, s), 6.93–6.96 (1H, m), 7.08 (1H, d, J=16.4 Hz), 7.12–7.29 (2H, m), 7.18 (1H, d, J=16.4 Hz), 7.29–7.36 (2H, m), 7.49–7.54 (3H, m), 7.58 (2H, d, J=8.8 Hz), 7.90 (2H, d, J=8.8 Hz), 11.57 (1H, broad s).

Example 8

In a manner similar to that in Example 6 except that 0.33 g of 4-amino-2-hydroxyazobenzene was used instead of 4-aminoazobenzene and that purification with column chromatography was not conducted, 0.38 g of the compound 8 was obtained.

Melting point: 285° C. (dec.);

Elemental analysis ($C_{28}H_{24}N_4O_3$): Calcd. (%): C, 72.40; H, 5.21; N, 12.06 Found (%): C, 72.12; H, 4.99; N, 11.93;

¹H-NMR δ(CDCl₃) ppm: 1.71 (6H, s), 3.63 (3H, s), 5.83 (1H, s), 7.16–7.25 (1H, m), 7.37–7.42 (2H, m), 7.50–7.59 (5H, m), 7.73 (1H, d, J=2.2 Hz), 7.80 (1H, d, J=8.8 Hz), 7.93–7.95 (2H, m), 11.53 (1H, broad s), 12.06 (1H, s).

Example 9

0.97 g of 3,4-dichloro-3-cyclobutene-1,2-dione was dissolved in 10 ml of dichloromethane. To this solution, 2.23 g of 1,3,3-trimethyl-2-methyleneindoline was added dropwise at 4° C., and the mixture was stirred at 4° C. for 1.5 hours. After the reaction, the precipitate was collected by filtration. To the obtained solid, 5 ml of trifluoroacetic acid and 0.07 g of water were added, and the mixture was allowed to react at 45° C. for 1 hour. After the reaction was completed, the reactant was concentrated with a rotary evaporator. To the concentrate, acetone was added, and the insoluble material was collected by filtration. To this insoluble material, 60 ml of n-butanol, 60 ml of toluene and 0.45 g of 2-aminothiazole were added, and the mixture was allowed to react at 110° C. for 13.5 hours. After the reaction was completed, the precipitate was collected by filtration. The obtained solid was purified by subjecting it to column chromatography (eluent: chloroform/methanol=10/1) to give 0.48 g of the compound 9.

Melting point: 264–266° C.;

Elemental analysis ($C_{19}H_{17}N_3O_2S$): Calcd. (%): C, 64.94; H, 4.88; N, 11.96 Found (%): C, 63.73; H, 4.68; N, 11.71;

IR (KBr) cm⁻¹:3442, 1765, 1612, 1589, 1533, 1498, 1398, 1292, 1234, 1076;

¹H-NMR δ(CDCl₃) ppm: 1.72 (6H, s), 3.55 (3H, s), 5.84 (1H, s), 6.79 (1H, m), 7.00 (1H, m), 7.16 (1H, m), 7.25 (1H, m), 7.32 (2H, m).

Example 10

In a manner similar to that in Example 9 except that 0.76 g of carbazole was used instead of 2-aminothiazole, 0.67 g of the compound 10 was obtained (eluent: chloroform/acetone=10/1).

Melting point: 258–258° C.;

Elemental analysis ($C_{28}H_{22}N_2O_2$): Calcd. (%): C, 80.36; H, 5.30; N, 6.69 Found (%): C, 80.08; H, 5.14; N, 6.51;

IR (KBr) cm⁻¹:1612, 1579, 1570, 1491, 1479, 1446, 1410, 1317, 1290, 1240, 1209, 1111;

¹H-NMR δ(CDCl₃) ppm: 1.86 (6H, s), 3.79 (3H, s), 6.26 (1H, s), 7.10–7.60 (8H, m), 7.92 (2H, m), 8.96 (2H, m).

Example 11

0.78 g of 3,4-dichloro-3-cyclobutene-1,2-dione was dissolved in 10 ml of chloroform. To this solution, 1.27 g of 1,3,3-trimethyl-2-methylene-5-methoxyindoline was added dropwise at 0° C., and the mixture was stirred at 0° C. for 30 minutes. After the reaction, the precipitate collected by filtration. To the obtained solid, 6 ml of trifluoroacetic acid and 1.5 ml of water were added, and the mixture was allowed to react at 40° C. for 15 minutes. After the reaction was completed, the reactant was concentrated with a rotary evaporator. To the concentrate, diethyl ether was added, and the insoluble material was collected by filtration. To this insoluble material, 9 ml of ethanol, 9 ml of toluene and 0.79 g of 4-aminoazobenzene were added, and the mixture was allowed to react at 80° C. for 1 hour. After the reaction was completed, the precipitate was collected by filtration. The obtained solid was purified by subjecting it to column chromatography (eluent: chloroform/methanol=10/1) to give 0.75 g of the compound 11.

Melting point: 280° C. or higher;

Elemental analysis ($C_{29}H_{26}N_4O_3$): Calcd. (%): C, 72.79; H, 5.48; N, 11.71 Found (%): C, 72.61; H, 5.25; N, 11.59;

¹H-NMR δ(CDCl₃) ppm: 1.76 (6H, s), 3.60 (3H, s), 3.80 (3H, m), 5.75 (1H, s), 6.95 (1H, dd, J=2.4, 8.8 Hz), 7.23 (1H, d, J=2.4 Hz), 7.33 (1H, d, J=8.8 Hz), 7.52–7.61 (3H, m), 7.86–7.93 (4H, m), 8.08–8.09 (2H, m), 11.42 (1H, broad s).

Example 12

In a manner similar to that in Example 11 except that 0.45 g of 4-amino-2-methoxyazobenzene was used instead of 4-aminoazobenzene and that purification with column chromatography was not conducted, 0.42 g of the compound 12 was obtained.

Melting point: 263° C. (dec.);

Elemental analysis ($C_{30}H_{28}N_4O_4$): Calcd. (%): C, 70.85; H, 5.55; N, 11.02 Found (%): C, 70.78; H, 5.37; N, 10.72;

¹H-NMR δ(CDCl₃) ppm: 1.71 (6H, s), 3.61 (3H, s), 3.80 (3H, s), 4.02 (3H, s), 5.78 (1H, s), 6.95 (1H, dd, J=2.2, 8.8 Hz), 7.23 (!H, d, J=2.2 Hz), 7.30 (1H, dd, J=2.2, 8.8 Hz), 7.34 (1H, d, J=8.8 Hz), 7.48–7.59 (2H, m), 7.61 (1H, d, J=8.8 Hz), 7.79–7.82 (2H, m), 8.28 (1H, d, J=2.2 Hz), 11.36 (1H, broad s).

Example 13

1.1 g of 3,4-dichloro-3-cyclobutene-1,2-dione was dissolved in 10 ml of ethyl acetate. To this solution, 3.25 g of 1,1,3-trimethyl-2-methylenebenz[e]indoline was added dropwise at 4° C., and the mixture was stirred at 4° C. for 2 hours. After the reaction, the precipitate was collected by filtration. To the obtained solid, 19.8 g of trifluoroacetic acid and 0.33 g of water were added, and the mixture was allowed to react at 45° C. for 3 hours. After the reaction was completed, the reactant was concentrated with a rotary evaporator. To the concentrate, acetone was added, and the insoluble material was collected by filtration. To this insoluble material, 20 ml of n-butanol, 20 ml of toluene and 0.99 g of 4-aminoazobenzene were added, and the mixture was allowed to react at 110° C. for 2 hours. After the reaction was completed, the precipitate was collected by filtration to give 2.31 g of the compound 13.

Melting point: 280° C. or higher;

Elemental analysis ($C_{32}H_{26}N_4O_2$): Calcd. (%): C, 77.09; H, 5.26; N, 11.24 Found (%): C, 77.21; H, 5.39; N, 11.14;

IR (KBr) cm$^{-1}$:1595, 1583,1564,1529, 1516, 1410, 1296, 1265, 1248, 1223, 1209.

Example 14

In a manner similar to that in Example 13 except that 0.72 g of 8-aminoquinoline was used instead of 4-aminoazobenzene, 2.06 g of the compound 14 was obtained.

Melting point: 249° C. (dec.);

Elemental analysis ($C_{29}H_{23}N_3O_2$): Calcd. (%): C, 78.18; H, 5.20; N, 9.43 Found (%): C, 78.22; H, 5.21; N, 9.32;

IR (KBr) cm$^{-1}$:1610, 1525, 1510, 1497, 1458, 1400, 1290, 1261;

$^1$H-NMR δ(CDCl$_3$) ppm: 2.07 (6H, s), 3.71 (3H, s), 5.99 (1H, s), 7.2–8.0 (8H, m), 8.1–8.2 (2H, m), 8.4–8.5 (1H, m), 9.0 (1H, d, J=7.6 Hz), 10.4 (1H, broad s).

Example 15

In a manner similar to that in Example 13 except that 0.76 g of 2-methyl-4-nitroaniline was used instead of 4-aminoazobenzene, 2.06 g of the compound 15 was obtained.

Melting point: 280° C. or higher (dec.);

Elemental analysis ($C_{27}H_{23}N_3O_4$): Calcd. (%): C, 71.51; H, 5.11; N, 9.27 Found (%): C, 71.48; H, 5.04; N, 9.16;

IR (KBr) cm$^{-1}$:1606, 1591, 1539, 1506, 1346, 1281, 1254;

$^1$H-NMR δ(CDCl$_3$) ppm: 2.03 (6H, s), 2.49 (3H, s), 3.81 (3H, s), 6.06 (1H, s), 7.3–8.3 (8H, m), 8.50 (1H, d, J=9 Hz).

Example 16

In a manner similar to that in Example 13 except that 1 g of carbazole was used instead of 4-aminoazobenzene and that column chromatography (eluent: n-hexane/acetone=10/1) was conducted, 0.22 g of the compound 16 was obtained.

Melting point: 218–219° C. (dec.);

Elemental analysis ($C_{32}H_{24}N_2O_2$): Calcd. (%): C, 82.03; H, 5.16; N, 5.98 Found (%): C, 81.77; H, 5.42; N, 5.64;

IR (KBr) cm$^{-1}$:1618, 1583, 1566, 1491, 1446, 1412, 1286, 1265, 1246, 1221, 1207, 1182;

$^1$H-NMR δ(CDCl$_3$) ppm: 2.12 (6H, s), 3.92 (3H, s), 6.32 (1H, s), 7.3–8.0 (11H, m), 8.20 (1H, d, J=8.5 Hz), 8.96 (2H, d, J=8.3 Hz).

Example 17

1.39 g of 3,4-dichloro-3-cyclobutene-1,2-dione was dissolved in 60 ml of methyl-t-butyl ether. To this solution, 5.34 g of 1,3-di-n-butyl-2-methylene-2,3-dihydroimidazo[4,5-b]quinoxaline was added dropwise at 4° C., and the mixture was stirred at 4° C. for 2 hours. After the reaction, the precipitate was collected by filtration. To the obtained solid, 6.47 g of trifluoroacetic acid and 0.12 g of water were added, and the mixture was allowed to react at 45° C. for 4 hours. After the reaction was completed, the reactant was concentrated with a rotary evaporator. To the concentrate, acetone was added, and the insoluble material was collected by filtration. To this insoluble material, 15 ml of n-butanol, 15 ml of toluene and 0.4 g of 1,2,3,4-tetrahydroquinoline were added, and the mixture was allowed to react at 110° C. for 2 hours. After the reaction was completed, the precipitate was collected by filtration, and the obtained solid was purified by subjecting it to column chromatography (eluent: chloroform/acetone=15/1) to give 0.97 g of the compound 17.

Melting point: 211–212° C.;

Elemental analysis ($C_{31}H_{35}N_5O_2$): Calcd. (%): C, 73.35; H, 6.55; N, 13.80 Found (%): C, 73.05; H, 6.49; N, 13.92;

IR (KBr) cm$^{-1}$:1620, 1589, 1510, 1481, 1464, 1452, 1396, 1336, 1325, 1300, 1273, 1178, 1122;

$^1$H-NMR δ(CDCl$_3$) ppm: 0.95 (6H, t, J=7.3 Hz), 1.30–1.40 (4H, m), 1.70–1.9 (4H, m), 2.16 (2H, m), 2.95 (2H, t, J=6.7 Hz), 4.53 (2H, t, J=5.6 Hz), 4.67 (4H, t, J=7.3 Hz), 5.55 (1H, s), 7.1–8.0 (8H, m).

Example 18

In a manner similar to that in Example 17 except that 0.29 g of 3-aminopyridine was used instead of 1,2,3,4-tetrahydroquinoline, 0.74 g of the compound 18 was obtained (eluent: chloroform/methanol=15/1).

Melting point: 259–260° C.;

Elemental analysis ($C_{27}H_{28}N_6O_2$): Calcd. (%): C, 69.21; H, 6.02; N, 17.94 Found (%): C, 68.98; H, 6.01; N, 17.73;

IR (KBr) cm$^{-1}$:1614, 1576, 1537, 1504, 1481, 1392, 1319, 1184, 1124;

$^1$H-NMR δ(CDCl$_3$) ppm: 0.95 (6H, t, J=7.5 Hz), 1.3–1.4 (4H, m), 1.80–1.9 (4H, m), 4.76 (4H, t, J=7.3 Hz), 5.69 (1H, s), 7.33 (1H, m), 7.67 (2H, m), 8.06 (2H, m), 8.35 (1H, m), 8.68 (1H, m), 8.98 (1H, d, J=2.2 Hz), 10.5 (1H, broad s).

Example 19

In a manner similar to that in Example 17 except that 0.44 g of 3-aminoquinoline was used instead of 1,2,3,4-tetrahydroquinoline and that purification with column chromatography was not conducted, 0.76 g of the compound 19 was obtained.

Melting point: 266° C. (dec.);

Elemental analysis ($C_{31}H_{30}N_6O_2$): Calcd. (%): C, 71.79; H, 5.83; N, 16.20 Found (%): C, 71.75; H, 5.63; N, 16.05;

IR (KBr) cm$^{-1}$:1624, 1593, 1574, 1549, 1504, 1473, 1462, 1394, 1317, 1182, 1122;

$^1$H-NMR δ(CDCl$_3$) ppm: 0.95 (6H, t, J=7.5 Hz), 1.30–1.50 (4H, m), 1.8–1.9 (4H, m), 4.78 (4H, t, J=7.5 Hz), 7.0 (1H, s), 7.4–8.1 (8H, m), 9.0 (1H, d, J=2.2 Hz), 9.2 (1H, d, J=2.7 Hz).

Example 20

In a manner similar to that in Example 17 except that 0.44 g of 8-aminoquinoline was used instead of 1,2,3,4-tetrahydroquinoline and that purification with column chromatography was not conducted, 0.48 g of the compound 20 was obtained.

Melting point: 233° C. (dec.);

Elemental analysis ($C_{31}H_{30}N_6O_2$): Calcd. (%): C, 71.79; H, 5.83; N, 16.20 Found (%): C, 71.51; H, 5.79; N, 15.90;

IR (KBr) cm$^{-1}$:1630, 1618, 1516, 1500, 1483, 1392, 1311, 1184, 1126, 1086;

$^1$H-NMR δ(CDCl$_3$) ppm: 0.96 (6H, t, J=7.3 Hz), 1.30–1.50 (4H, m), 1.8–1.9 (4H, m), 4.77 (4H, t, J=7.3 Hz), 5.73 (1H, s), 7.4–7.7 (5H, m), 8.0 (2H, m), 8.16 1H, m), 8.8 (1H, m), 8.95 (1H, m), 10.3 (1H, broad s).

Example 21

The maximum absorption wavelength ($\lambda_{max}$) and the log ε (ε is a molar extinction coefficient) at the maximum absorption wavelength for a solution of the compound prepared in Example 1, 2, 7, 8, 10, 13, 15 or 17 in chloroform were measured. The results are shown in Table 6.

Example 22

T1, T2, (m1−m2)(%)/(T2−T1)(°C.) and (m1−m2)(%) for the compounds prepared in Examples 1, 2, 7, 8, 10, 13, 15 and 17 measured with TG-DTA (a thermogravimetric-differential thermal analyzer) are shown in Table 6.

Comparative Example

The spectroscopic (maximum absorbing wavelength and molar extinction coefficient) and thermal decomposition properties (weight losing-initiation temperature, weight losing-termination temperature, ratio of the loss in weight, and temperature slope of the loss in weight) which were measured for the squarylium compound represented by the following formula (a) (Japanese Unexamined Patent Publication No. 92914/1994) in a manner similar to those in Examples 21 and 22 are shown in Table 6.

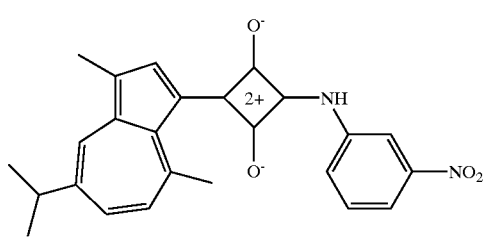
(a)

Examples relating to the optical recording media will be illustrated below.

Example 23

A solution prepared by dissolving the compound 1 in 2,2,3,3-tetrafluoro-1-propanol was spinner-coated on an injection molded-polycarbonate substrate of 0.6 mm thickness having a guiding groove of the groove depth of 1,750Å, the half band width of 0.25 μm, and the track pitch of 0.74 μm to form an organic dye layer having a thickness of 900Å. The optical constants of the resulting recording membrane are shown in Table 7. In the table, n represents a refractive index of the single layer of the recording layer, and k represents an extinction coefficient.

Then, a gold refractive layer having a thickness of 1,200Å was provided thereon by a sputtering method, the protective layer having a thickness of 7 μm was further provided thereon with an acrylic photopolymer, and then an injection molded-polycarbonate flat substrate having a thickness of 0.6 mm was adhered thereto with an acrylic photopolymer to prepare a recording medium.

An EFM signal was recorded on the prepared recording medium with tracking (linear speed of 3.5 m/sec.) using the semiconductor laser beam having an oscillation wavelength of 650 nm and a beam diameter of 1.0 μm, and then the recorded signal was reproduced with a continuous beam of the semiconductor laser having an oscillation wavelength of 650 nm (reproduction power of 0.7 mW). The resulting signal properties are shown in Table 8.

Examples 24–28

The recording membrane was formed in a manner completely similar to that in Example 23 except that the compound 10, 11, 14, 16 or 18 was used instead of the compound 2 (Examples 24–28). The optical constants of the resulting recording membrane are shown in Table 7. Furthermore, the recording medium was formed in a manner completely similar to that in Example 23 and the signal properties thereof were measured. The resulting signal properties are shown in Table 8.

TABLE 6

Spectroscopic and thermal decomposition properties of squarylium compounds

| Compounds | Spectroscopic properties (chloroform solution) | | Thermal decomposition properties | | | |
|---|---|---|---|---|---|---|
| | $\lambda_{max}$ (nm) | log ε | T1 (°C.) | T2 (°C.) | (m1 − m2) (%) / (T2 − T1) (°C.) | (m1 − m2) (%) |
| 1 | 550.5 | 5.1 | 269.3 | 283.6 | 1.5 | 21.3 |
| 2 | 569.0 | 5.2 | 250.6 | 262.3 | 1.9 | 22.5 |
| 7 | 551.0 | 5.0 | 307.0 | 317.0 | 2.3 | 22.7 |
| 8 | 572.0 | 5.2 | 302.0 | 317.0 | 1.8 | 26.7 |
| 10 | 567.0 | 5.1 | 277.5 | 290.4 | 1.7 | 21.7 |
| 13 | 574.0 | 5.1 | 346.7 | 368.0 | 1.5 | 32.1 |
| 15 | 567.5 | 5.1 | 312.3 | 336.1 | 1.1 | 25.2 |
| 17 | 576.0 | 5.0 | 292.1 | 310.6 | 1.6 | 30.4 |
| Comparative Examples | | | | | | |
| a | 568.0 | 4.7 | 255.3 | 264.7 | 1.5 | 14.1 |

TABLE 7

Optical constants of recording membrane

| | $\lambda = 635$ nm | | $\lambda = 650$ nm | |
|---|---|---|---|---|
| | n | k | n | k |
| Compound 2 | 2.54 | 0.30 | 2.66 | 0.13 |
| Compound 10 | 2.61 | 0.10 | 2.40 | 0.05 |
| Compound 11 | 2.91 | 0.32 | 2.67 | 0.10 |
| Compound 14 | 2.55 | 0.03 | 2.39 | 0.02 |
| Compound 16 | 2.66 | 0.22 | 2.41 | 0.05 |
| Compound 18 | 3.04 | 0.49 | 2.77 | 0.12 |

TABLE 8

Signal properties of recording medium

| | Reflectance (%): flat portion | Modulation depth (%): $I_{11}I_{top}$ | Jitter (%) |
|---|---|---|---|
| Example 23 (Compound 2) | 65.2 | 61.7 | 8.8 |
| Example 24 (Compound 10) | 63.7 | 62.8 | 9.0 |
| Example 25 (Compound 11) | 65.5 | 61.5 | 8.6 |
| Example 26 (Compound 14) | 63.3 | 63.2 | 8.9 |
| Example 27 (Compound 16) | 63.8 | 62.4 | 9.1 |
| Example 28 (Compound 18) | 65.7 | 60.8 | 8.7 |

Example 29

A recording medium was formed, using a mixture of the compound 2 and the metal complex No. 3 (see Table 4; weight ratio of compound 2/metal complex No. 3=10/3) instead of the compound 2 in Example 23.

A light from a xenon lamp (50,000 luxes) was irradiated on this recording medium for 10 hours, and a remaining ratio of an optical density was evaluated. The remaining ratio of an optical density was calculated by the following equation:

Remaining ratio of an optical density=$I_d/I_o \times 100$ (%)

$I_d$: Optical density after irradiation;
$I_o$: Optical density before irradiation.

The results of the light resistance test are shown in Table 9.

Examples 30–32

The recording layer was formed, using the aromatic amine compound No. 104 (see Table 5) instead of the metal complex No. 3 (Example 30), and further using a mixture of the compound 11 and the metal complex No. 12 (see Table 4) instead of a mixture of the compound 2 and the metal complex No .3 (Example 31), or a mixture of the compound 11 and the aromatic amine compound No. 113 (see Table 4) instead of a mixture of the compound 2 and the metal complex No. 3 (Example 32) in Example 29. A light resistance test was performed on the resulting recording layer in a manner similar to that in Example 29. The results of the light resistance test are shown in Table 9.

TABLE 9

Results of light resistance test of recording layer

| | Compound Nos. | Light stabilizer Nos. | Remaining ratio of Optical density (%) |
|---|---|---|---|
| Example 23 | 2 | — | 22 |
| Example 25 | 11 | — | 28 |
| Example 29 | 2 | 3 | 88 |
| Example 30 | 2 | 104 | 92 |
| Example 31 | 11 | 12 | 90 |
| Example 32 | 11 | 113 | 93 |

INDUSTRIAL APPLICABILITY

According to the present invention, there can be provided squarylium compounds having spectroscopic and thermal decomposition properties suitable for an oscillation wavelength of a semiconductor laser utilized for a digital versatile disc-recordable (DVD-R). Also, DVD-R media having the excellent light resistance as well as the high reflectance and modulation depth can be provided by using the squarylium compound prepared by the present invention as a recording material.

What is claimed is:

1. An optical recording medium, which comprises a recording layer containing a squarylium compound represented by the general formula (I):

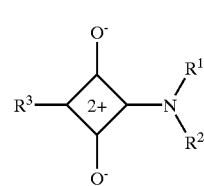

(I)

wherein, $R^1$ and $R^2$ are the same or different, and represent a hydrogen atom, an alkyl group optionally having a substituent, an aralkyl group optionally having a substituent, an aryl group optionally having a substituent or a heterocyclic group optionally having a substituent, or $R^1$ and $R^2$ may be taken together with an adjacent nitrogen atom to form a heterocycle, wherein the heterocycle may have a substituent; and $R^3$ represents the general formula (II):

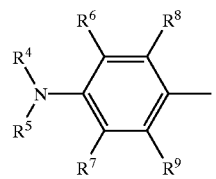

(II)

wherein $R^4$ and $R^5$ are the same or different, and represent a hydrogen atom or an alkyl group, or $R^4$ and $R^5$ may be taken together with an adjacent nitrogen atom to form a heterocycle; and $R^6$, $R^7$, $R^8$ and $R^9$ are the same or different, and represent a hydrogen atom, an alkyl group optionally having a substituent or an alkoxy group optionally having a substituent, a hydroxyl group or a halogen atom, or $R^4$ and $R^6$ or $R^5$ and $R^7$ may be taken together with adjacent N—C—C to form a heterocycle, wherein the heterocycle may have a substituent; or $R^3$ represents the general formula (III):

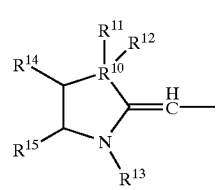
(III)

wherein, $R^{10}$ represents a carbon or nitrogen atom; $R^{11}$ and $R^{12}$ are the same or different, and represent a hydrogen atom, an alkyl group optionally having a substituent, an aryl group optionally having a substituent, an aralkyl group optionally having a substituent or a hydroxyl group (provided that, when $R^{10}$ is a nitrogen atom, then $R^{12}$ is not present); $R^{13}$ represents a hydrogen atom, an alkyl group optionally having a substituent, an aryl group optionally having a substituent or an aralkyl group optionally having a substituent; and $R^{14}$ and $R^{15}$ are the same or different, and represent a hydrogen atom, an alkyl group optionally having a substituent, an alkoxy group or a halogen atom, or $R^{14}$ and $R^{15}$ may be taken together with two adjacent carbon atoms to form an alicyclic hydrocarbon ring, an aromatic ring optionally having a substituent or a heterocycle optionally having a substituent.

2. The optical recording medium according to claim 1, wherein the recording layer contains a light stabilizer.

3. The optical recording medium according to claim 2, wherein the light stabilizer is selected from the group consisting of a metal complex and an aromatic amine.

4. The optical recording medium according to claim 3, which contains 5–40% by weight of the light stabilizer relative to the squarylium compound.

5. The optical recording medium according to any one of claims 2–4 or 1, wherein a single layer of the recording layer has the refractive index (n) of $1.5 \leq n \leq 3.0$ and the extinction coefficient (k) of $0.02 \leq k \leq 0.3$ for the light of a wavelength range of a recording or reproducing wavelength ±5 nm.

6. The optical recording medium according to any one of claims 2–4 or 1, wherein the squarylium compound has a temperature slope of the loss in weight in a principal loss-in-weight process in a thermogravimetric analysis of 1%/°C. or greater.

7. The optical recording medium according to any one of claims 2–4 or 1, wherein the squarylium compound has a ratio of the loss in weight in the principal loss-in-weight process in a thermogravimetric analysis of 20% or greater and a weight losing-initiation temperature of 350° C. or lower.

8. The optical recording medium according to any one of claims 2–4 or 1, which has a track pitch on a substrate within the range of 0.7–0.8 μm and a groove width at a half band width within the range of 0.20–0.36 μm.

9. The optical recording medium according to any one of claims 2–4 or 1, which has a recording or reproducing wavelength within the range of 600–700 nm.

10. The optical recording medium according to any one of claims 2–4 or 1, which has a maximum absorbing wavelength within the range of 550–600 nm and a log ε (ε is a molar extinction coefficient) at said maximum absorbing wavelength of 5 or bigger.

11. A squarylium compound represented by the general formula (Ia):

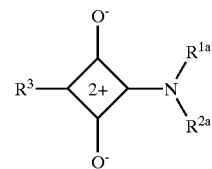
(Ia)

wherein, $R^{1a}$ and $R^{2a}$ are taken together with an adjacent nitrogen atom to form a carbazole ring optionally having a substituent; and $R^3$ represents the general formula (II):

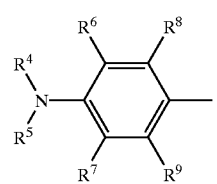
(II)

wherein, $R^4$ and $R^5$ are the same or different, and represent a hydrogen atom or an alkyl group, or $R^4$ and $R^5$ may be taken together with an adjacent nitrogen atom to form a heterocycle; and $R^6$, $R^7$, $R^8$ and $R^9$ are the same or different, and represent a hydrogen atom, an alkyl group optionally having a substituent or an alkoxy group optionally having a substituent, a hydroxyl group or a halogen atom, or $R^4$ and $R^6$ or $R^5$ and $R^7$ may be taken together with adjacent N—C—C to form a heterocycle, wherein the heterocycle may have a substituent; or $R^3$ represents the general formula (III):

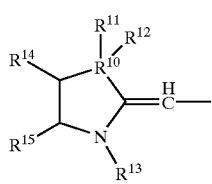
(III)

wherein, $R^{10}$ represents a carbon or nitrogen atom; $R^{11}$ and $R^{12}$ are the same or different, and represent a hydrogen atom, an alkyl group optionally having a substituent, an aryl group optionally having a substituent, an aralkyl group optionally having a substituent or a hydroxyl group (provided that, when $R^{10}$ is a nitrogen atom, then $R^{12}$ is not present); $R^{13}$ represents a hydrogen atom, an alkyl group optionally having a substituent, an aryl group optionally having a substituent or an aralkyl group optionally having a substituent; and $R^{14}$ and $R^{15}$ are the same or different, and represent a hydrogen atom, an alkyl group optionally having a substituent, an alkoxy group or a halogen atom, or $R^{14}$ and $R^{15}$ may be taken together with two adjacent carbon atoms to form an alicyclic hydrocarbon ring, an aromatic ring optionally having a substituent or a heterocycle optionally having a substituent.

12. The squarylium compound according to claim 11, wherein $R^3$ is a group represented by the general formula (III).

13. A squarylium compound represented by the general formula (Ib):

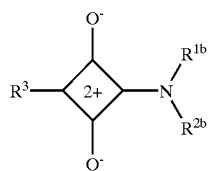

(Ib)

wherein, $R^{1b}$ represents a hydrogen atom, and $R^{2b}$ represents an aryl group substituted with $-R^{16}=R^{17}-Ar$ ($R^{16}$ and $R^{17}$ are the same, and represent N or CH, and Ar represents an aryl group optionally substituted with a substituent selected from the group consisting of a hydroxyl group, a carboxyl group, a nitro group, an alkoxy group, an alkyl group optionally substituted with a halogen group, or a cyano group and a halogen atom); and $R^3$ represents the general formula (II):

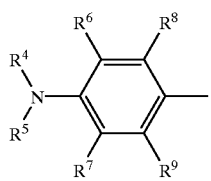

(II)

wherein, $R^4$ and $R^5$ are the same or different, and represent a hydrogen atom or an alkyl group, or $R^4$ and $R^5$ may be taken together with an adjacent nitrogen atom to form a heterocycle; and $R^6$, $R^7$, $R^8$ and $R^9$ are the same or different, and represent a hydrogen atom, an alkyl group optionally having a substituent or an alkoxy group optionally having a substituent, a hydroxyl group or a halogen atom, or $R^4$ and $R^6$ or $R^5$ and $R^7$ may be taken together with adjacent N—C—C to form a heterocycle, wherein the heterocycle may have a substituent; or $R^3$ represents the general formula (III):

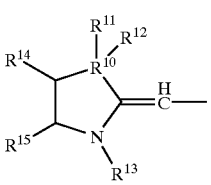

(III)

wherein, $R^{10}$ represents a carbon or nitrogen atom; $R^{11}$ and $R^{12}$ are the same or different, and represent a hydrogen atom, an alkyl group optionally having a substituent, an aryl group optionally having a substituent, an aralkyl group optionally having a substituent or a hydroxyl group (provided that, when $R^{10}$ is a nitrogen atom, then $R^{12}$ is not present); $R^{13}$ represents a hydrogen atom, an alkyl group optionally having a substituent, an aryl group optionally having a substituent or an aralkyl group optionally having a substituent; and $R^{14}$ and $R^{15}$ are the same or different, and represent a hydrogen atom, an alkyl group optionally having a substituent, an alkoxy group or a halogen atom, or $R^{14}$ and $R^{15}$ may be taken together with two adjacent carbon atoms to form an alicyclic hydrocarbon ring, an aromatic ring optionally having a substituent or a heterocycle optionally having a substituent.

14. The squarylium compound according to claim 13, wherein $R^3$ is a group represented by the general formula (III).

15. An optical recording medium, which comprises a recording layer containing the squarylium compound according to any one of claim 12, 14, 11, or 13.

16. The optical recording medium according to claim 15, wherein the recording layer contains a light stabilizer.

17. A squarylium compound represented by the general formula (Ic):

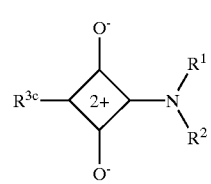

(Ic)

wherein, $R^1$ and $R^2$ are the same or different, and represent a hydrogen atom, an alkyl group optionally having a substituent, an aralkyl group optionally having a substituent, an aryl group optionally having a substituent or a heterocyclic group optionally having a substituent, or $R^1$ and $R^2$ may be taken together with an adjacent nitrogen atom to form a heterocycle, wherein the heterocycle may have a substituent; and $R^{3c}$ represents the general formula (III):

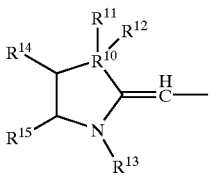

(III)

wherein, $R^{10}$ represents a carbon or nitrogen atom; $R^{11}$ and $R^{12}$ are the same or different, and represent a hydrogen atom, an alkyl group optionally having a substituent, an aryl group optionally having a substituent, an aralkyl group optionally having a substituent or a hydroxyl group (provided that, when $R^{10}$ is a nitrogen atom, then $R^{12}$ is not present); $R^{13}$ represents a hydrogen atom, an alkyl group optionally having a substituent, an aryl group optionally having a substituent or an aralkyl group optionally having a substituent; and $R^{14}$ and $R^{15}$ are the same or different, and represent a hydrogen atom, an alkyl group optionally having a substituent, an alkoxy group or a halogen atom, or $R^{14}$ and $R^{15}$ may be taken together with two adjacent carbon atoms to form an alicyclic hydrocarbon ring, an aromatic ring optionally having a substituent or a heterocycle optionally having a substituent.

18. An optical recording medium, which comprises a recording layer containing the squarylium compound represented by the general formula (Ic) of claim 17.

19. The optical recording medium according to claim 18, wherein the recording layer contains a light stabilizer.

20. The optical recording medium according to claim 19, wherein the light stabilizer is selected from the group consisting of a metal complex and an aromatic amine.

21. The optical recording medium according to claim 20, which contains 5–40% by weight of the light stabilizer relative to the squarylium compound.

22. The optical recording medium according to any one of claims 18–21, wherein a single layer of the recording layer has the refractive index (n) of $1.5 \leq n \leq 3.0$ and the extinction coefficient (k) of 0.02≦k<0.3 for the light of a wavelength range of a recording of reproducing wavelength ±5 nm.

23. The optical recording medium according to any one of claims 18–21, wherein the squarylium compound has a temperature slope of the loss in weight in a principal loss-in-weight process in a thermogravimetric analysis of 1%/°C. or greater.

24. The optical recording medium according to any one of claims 18–21, wherein the squarylium compound has a ratio of the loss in weight in the principal loss-in-weight process in a thermogravimetric analysis of 20% or greater and a weight loss-initiation temperature of 350° C. or lower.

25. The optical recording medium according to any one of claims 18–21 which has a track pitch on a substrate within the range of 0.7–0.8 μm and a groove width at a half band width within the range of 0.20–0.36 μm.

26. The optical recording medium according to any one of claims 18–21, which has a recording or reproducing wavelength within the range of 600–700 nm.

27. The optical recording medium according to any one of claims 18–21, which has a maximum absorbing wavelength within the range of 550–600 nm and a log $\epsilon$ ($\epsilon$ is a molar extinction coefficient) at said maximum absorbing wavelength of 5 or bigger.

* * * * *